United States Patent
Boeve

(10) Patent No.: US 7,251,156 B2
(45) Date of Patent: Jul. 31, 2007

(54) MAGNETIC MEMORY ARCHITECTURE WITH SHARED CURRENT LINE

(75) Inventor: Hans Marc Bert Boeve, Eindhoven (NL)

(73) Assignee: NXP B.V., Eindhoven (NL)

( * ) Notice: Subject to any disclaimer, the term of this patent is extended or adjusted under 35 U.S.C. 154(b) by 56 days.

(21) Appl. No.: 10/536,292

(22) PCT Filed: Nov. 6, 2003

(86) PCT No.: PCT/IB03/05060

§ 371 (c)(1),
(2), (4) Date: May 25, 2005

(87) PCT Pub. No.: WO2004/049345

PCT Pub. Date: Jun. 10, 2004

(65) Prior Publication Data

US 2006/0023490 A1    Feb. 2, 2006

(30) Foreign Application Priority Data

Nov. 28, 2002    (EP) .................................. 02080006

(51) Int. Cl.
*G11C 11/00*    (2006.01)
(52) U.S. Cl. ...................... 365/158; 365/171; 365/173
(58) Field of Classification Search ................ 365/158, 365/171, 173
See application file for complete search history.

(56) References Cited

U.S. PATENT DOCUMENTS 6,385,083 B1 *  5/2002  Sharma et al. .............. 365/171
7,069,568 B2 *  6/2006  Coehoorn et al. .......... 720/659

* cited by examiner

*Primary Examiner*—Huan Hoang
(74) *Attorney, Agent, or Firm*—Peter Zawilski

(57) ABSTRACT

The present invention relates to magnetic or magnetoresistive random access memories (MRAMs). The present invention provides an array with magnetoresistive memory cells arranged in logically organized rows and columns, each memory cell including a magnetoresistive element (32A, 32B). The matrix comprises a set of column lines (34), a column line (34) being cells of a column. A column line (34) is shared by two adjacent columns, the shared column line (34) having an area which extends a continuous conductive strip which is magnetically couplable to the magnetoresistive element (32A, 32B) of each of the memory cells of a column. A column line (34) is shared by two adjacent columns, the shared column line (34) having an area which extends over substantially the magnetoresistive elements of the two adjacent columns sharing that column line. According to the present invention, the array furthermore comprises at least one supplementary column line (36A, 36B) per column for generating a localized magnetic field in the magnetoresistive elements (32A, 32B) of one of the adjacent columns sharing the column line (34). It is an advantage of the present invention that a higher density of the memory cells can be obtained, thus reducing space required to make a MRAM memory.

9 Claims, 12 Drawing Sheets

MAGNETIC MEMORY ARCHITECTURE WITH SHARED CURRENT LINE

The present invention relates to magnetic or magnetoresistive random access memories (MRAMs), and more particularly to a method and a device for creating higher magnetic fields at maximum current density.

Magnetic or Magnetoresistive Random Access Memory (MRAM) is currently being considered by many companies as a successor to flash memory. It has the potential to replace all but the fastest static RAM (SRAM) memories. It is a non-volatile memory device, which means that no power is required to sustain the stored information. This is seen as an advantage over most other types of memory.

The MRAM concept was originally developed at Honeywell Corp. USA, and uses magnetization direction in a magnetic multilayer device as information storage and the resultant resistance difference for information readout. As with all memory devices, each cell in an MRAM array must be able to store at least two states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR or Magnetic Tunnel Junction (MTJ) or Spin Dependent Tunneling (SDT) effect provide possibilities to realize a.o. non-volatile magnetic memories. These devices comprise a stack of thin films of which at least two are ferromagnetic or ferrimagnetic, and which are separated by a non-magnetic interlayer. GMR is the magneto-resistance for structures with conductor interlayers and TMR is the magneto-resistance for structures with dielectric interlayers. If a very thin conductor is placed between two ferromagnetic or ferrimagnetic films, then the effective in-plane resistance of the composite multilayer structure is smallest when the magnetization directions of the films are parallel and largest when the magnetization directions of the films are anti-parallel. If a thin dielectric interlayer is placed between two ferromagnetic or ferrimagnetic films, tunneling current between the films is observed to be the largest (or thus resistance to be the smallest) when the magnetization directions of the films are parallel and tunneling current between the films is the smallest (or thus resistance the largest) when the magnetization directions of the films are anti-parallel.

Magneto-resistance is usually measured as the percentage increase in resistance of the above structures going from parallel to anti-parallel magnetization states. TMR devices provide higher percentage magneto-resistance than GMR structures, and thus have the potential for higher signals and higher speed. Recent results indicate tunneling giving over 40% magneto-resistance, compared to 6-9% magneto-resistance in good GMR cells.

An MRAM comprises a plurality of magnetoresistive memory units 1 arranged in an array. One such prior art memory unit 1 is shown in FIG. 1. Each memory unit 1 comprises a magnetoresistive memory element 2, a first intersection of a digit line 4 and a bit line 6, and a second intersection of the bit line 6 and a word line 8. The memory units 1 are coupled in series in columns by means of the bit lines 6 and coupled in series in rows by means of the digit lines 4 and word lines 8, thus forming the array. The magnetoresistive memory elements 2 used may for example, but not limited thereto, be magnetic tunnel junctions (MTJs).

MTJ memory elements 2 generally include, as shown in FIG. 2, a layered structure comprising a fixed or pinned layer 10, a free layer 12 and a dielectric barrier 14 in between. The MTJ memory element 2 furthermore comprises a non-magnetic conductor forming a lower electrical contact 22, and an upper contact 16 on the free magnetic layer 12. The pinned magnetic layer 10 and the free magnetic layer 12 may both be composed of e.g. NiFe, and the dielectric barrier layer 14 may e.g. be made of AlOx. By applying a small voltage over the sandwich of ferromagnetic or ferrimagnetic layers 10, 12 with the dielectric 14 therebetween, electrons can tunnel through the dielectric barrier 14.

The pinned layer 10 of magnetic material has a magnetic vector that always points in the same direction. The magnetic vector of the free layer 12 is free, but constrained by the physical size of the layer, to point in either of two directions: parallel or anti-parallel with the magnetization direction of the pinned layer 10.

An MTJ memory element 2 is used by connecting it in a circuit such that electricity can flow vertically through the element 2 from one of the magnetic layers to the other. The MTJ unit 1 can be electrically represented by a resistor R in series with a switching element such as a transistor T, as shown in FIG. 1. The size of the resistance of the resistor R depends on the orientation of the magnetic vectors of the free and pinned magnetic layers of the memory element 2. The MTJ element 2 has a relatively high resistance (HiRes) when the magnetic vectors point in opposite directions, and it has a relatively low resistance (LoRes) when the magnetic vectors point in the same direction.

A diagrammatic elevational view of a 2×2 array of prior art memory units is shown in FIG. 2. In an MRAM array, comprising a plurality of MRAM units, orthogonal conductive lines 4, 6 pass under and over each bit or memory element 2, carrying current that produces a switching field. Each bit is designed so that it will not switch when current is applied to just one line, but will switch when current is flowing through both lines 4, 6 that cross at the selected bit (switching will occur only if the magnetic vector of the free layer is not in accordance with the direction of the switching field).

Digit lines 4 and bit lines 6 are provided in an array of MTJ memory units or cells 1, where the digit lines 4 travel along the rows of the array on one side of the memory elements 2, and the bit lines 6 travel down the columns of the array on the opposite side of the memory elements 2. The structure in FIG. 2 is partially inverted for clarity purposes: digit lines 4 physically run underneath the MTJ elements 2 (at that side of the MTJ elements 2 oriented towards the substrate in which the transistor T is provided), and bit lines 6 physically run over the MTJ elements 2 (at that side of the MTJ elements 2 oriented away from the substrate in which the transistor T is provided). However, if drawn that way, the bit lines 6 would obscure the magnetoresistive elements 2, which are the more relevant parts of the drawing.

The memory element 2 is connected to the transistor T by means of an interconnect layer 16 and a plurality of metalization layers 18 and vias 20. There is a galvanic connection 22 between the memory element 2 and the bit line 6. The transistor T of each memory unit 1 is connected to a ground line 24.

In write or program mode, required currents flow through selected digit lines 4 and bit lines 6 so that at their intersection a peak magnetic field is generated, sufficient to switch the polarization of the free layer 12 of the MTJ element 2, so as to switch the resistance of the MTJ unit 2 from the LoRes (low resistance) state to the HiRes (high resistance) state or vice versa (depending on the direction of the current through the bit line 6). At the same time, the switching element such as transistor T in the selected memory unit 1 (the memory unit at the intersection of the selected digit line 4 and the selected bit line 6) is in the cut-off state, for example by keeping the voltage on the word line 8 low (0 volt in case the switching element is a transistor T). The currents in the selected digit line 4 and the selected bit line 6 are such that together they provide a magnetic field able to change the direction of the magnetic vector of the free layer of the selected memory element, but the current in either strip by itself is not able to change the storage state. Therefore only the selected memory element is written, not any of the other memory elements on the same selected digit line 4 or bit line 6.

FIG. 3 diagrammatically illustrates a typical integration scheme for prior art high-density MRAM-cells 1. Magnetic fields are created on-chip by sending currents through bit lines 6 and digit lines 4, in general called current lines, and are proportional to the current through these current lines. For obtaining higher magnetic fields, higher currents need to be used. However, low power applications will require low currents. Those are contradictory requirements. Scaling of MRAM technology into the sub-100 nm area is desirable in order to get smaller memories, but it is not straightforward. Scaling laws are also applied to the current lines, in particular to their cross-section. The current density in a current line is limited to $\sim 10^7$ A/cm$^2$, a typical electromigration limit for Cu. At higher current densities, electromigration takes place, i.e. metal atoms migrate in the current line, resulting in a break in the metal line. The above-mentioned limit sets an upper limit to the current in a Cu current line to 1 mA per 100 nm×100 nm section. In other words, the magnetic field amplitude which can be generated when scaling down prior art magnetoresistive memory devices is limited. Due to the smaller cross-section of the current lines when scaling down, in combination with a fixed electromigration limit, the magnetic field generation does not scale properly. From FIG. 3 can be seen that the digit lines have an undesirable geometry (width smaller than height).

Moreover, in order to preserve long-term thermal stability of the data bits, switching fields typically increase when scaling down MRAM devices. Magnetic elements typically have some aspect ratio to stabilize favorable magnetization directions by shape anisotropy. However, smaller dimensions lead to increasing switching fields for a fixed aspect ratio. Therefore, the aspect ratio should be reduced for smaller devices. On the other hand, long-term thermal stability, i.e. data retention, requires a certain minimal energy barrier ($K_uV$) against switching, which is basically setting a minimum value for the switching field ($\sim K_u$).

In US 2002/0057593, a thin film magnetic memory device having a highly integrated memory array is described. A top view and a cross-sectional view respectively are shown in FIG. 9. Read word lines and write word lines 80 are provided corresponding to the respective memory cell rows, and bit lines 81 and reference voltage lines are provided corresponding to the respective memory cell columns. Adjacent memory cells 82 share at least one of these signal lines, for example the bit lines 81. As a result, the pitches of the signal lines provided in the entire memory array can be widened. Thus, the memory cells can be efficiently arranged, achieving improved integration of the memory array. However, in order to conduct the data read and write operations normally, a plurality of memory cells 82 simultaneously selected by a single bit line 81 must not simultaneously receive a data write magnetic field from the word write line 80. Accordingly, the cells 82 are arranged alternately. FIG. 9 illustrates the alternate filling of the memory matrix. This embodiment has the disadvantage that there is a significant loss of density. Some density improvement is possible by shifting the memory cells 82 closer together, e.g. by aligning the via contacts to the transistor, as shown in FIG. 10. What is shown in dashed lines in the cross-sectional view of FIG. 10, are elements on a neighboring write word line 80. As the signal line (under bit line 81) is functional, only a small improvement can be obtained in the width of the bit line 81. This embodiment still has the disadvantage that a lot of memory density is lost.

It is an object of the present invention to provide a device and method for improving magnetic field generation. Improved magnetic field generation includes: generating a higher magnetic field for a given current density and/or decreasing cross-talk to neighboring, non-selected memory cells, and/or creating a better uniformity of the magnetic field throughout the memory device.

The above objective is accomplished by a method and device according to the present invention.

The present invention provides an array with magnetoresistive memory cells arranged in logically organized rows and columns, each memory cell including a magnetoresistive element. The matrix comprises a set of column lines, a column line being a continuous conductive strip which is magnetically couplable to the magnetoresistive element of each of the memory cells of a column. A column line is shared by two adjacent columns, the shared column line having an area which extends over substantially the magnetoresistive elements of the two adjacent columns sharing that column line. According to the present invention, the array furthermore comprises at least one supplementary column line per column for generating a localized magnetic field in the magnetoresistive elements of one of the adjacent columns sharing the column line. It is an advantage of the present invention that density of the memory cells can be improved with respect to prior art memory devices with shared column lines, thus reducing space required to make an MRAM memory.

According to an embodiment of the present invention, a supplementary column line may form a return current path for current carried by a column line. A magnetic field created from current flowing through the return current path is used to increase the magnetic field in the memory elements of a selected column. The increased field provides better writing to a memory element for example.

The array may furthermore comprise a set of row lines, each row line being a continuous conductive strip which is magnetically couplable to the magnetoresistive element of each of the memory cells of a row. A combined magnetic field generated by current through a row line corresponding to a selected memory cell, by current through a column line corresponding to the selected memory cell, and by current through the return column line corresponding to the selected memory cell is sufficiently high for switching (dependent on the content of the memory cell) the magnetic status of the magnetoresistive element of the selected memory cell. A magnetic field generated by current through any one of the named current lines, or a combination of magnetic fields generated by not all the named current lines, is preferably not high enough to provide a switching field. It is an advantage of the present invention that lower current levels can be sent through the row line, column line and return line, while still a switching field is generated.

In an embodiment of the present invention, a column line and a supplementary column line are provided at opposite sides of a column of magnetoresistive elements.

A column of magnetoresistive elements may be placed offset in a row-direction with regard to a center of a supplementary column line.

The column lines and/or the supplementary column lines and/or the row lines may be provided with a flux guiding cladding layer. An advantage of such cladding layer is that the magnetic fields in the column lines are more concentrated, and that cross-talk is reduced, hence unwanted programming of neighboring bits is avoided.

The present invention also provides a non-volatile memory comprising the array with magnetoresistive memory cells as described above, i.e. an array as described above, provided with a.o. suitable row and column drivers.

The present invention furthermore provides a method of operating an array with magnetoresistive memory cells arranged in logically organized rows and columns, each cell including a magnetoresistive element. The method comprises: applying current to a row line, applying current to a column line shared by two columns, and applying current to at least one supplementary column line for generating a localized magnetic field in one of the memory elements on the column line.

The present invention also provides a method of manufacturing an array with magnetoresistive memory cells. The method comprises: providing magnetoresistive memory cells arranged in logically organized rows and columns, each cell including a magnetoresistive element, providing a set of column lines, a column line being a continuous conductive strip which is magnetically couplable to the magnetoresistive element of each of the memory cells of a column, a column line being shared by two adjacent columns, the shared column line having an area which extends over substantially the magnetoresistive elements of the two adjacent columns sharing that column line, and providing at least one supplementary column line per column for generating a localized magnetic field in the magnetoresistive elements of one of the adjacent columns sharing the column line.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 6:
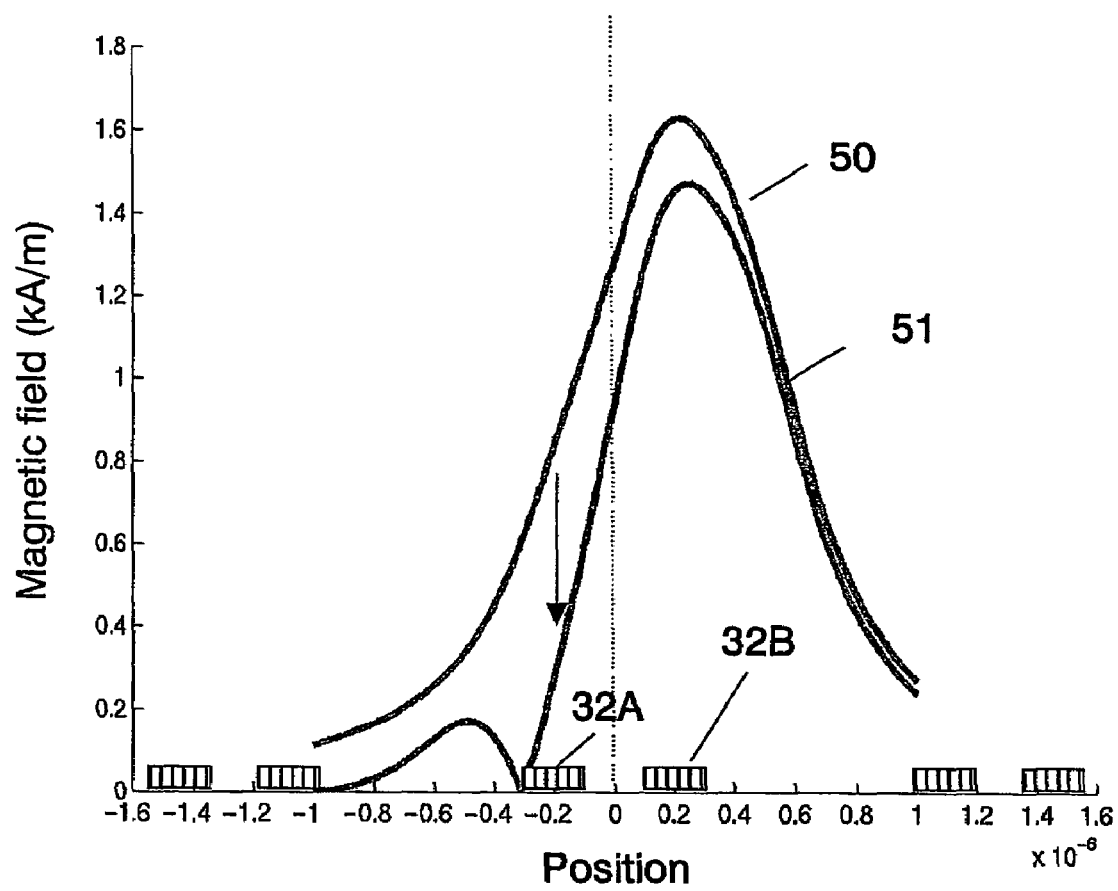

FIG. 6 is a graph of the calculated magnetic field component profile for a selected and a non-selected column sharing a column line. A first case is represented in which a return path is formed by a supplementary column line influencing the magnetic field at the selected column. A second case is represented in which a return path is formed by a first supplementary column line influencing the magnetic field at the selected column, and a second supplementary column line influencing the magnetic field at the non-selected column.

Figure 7:
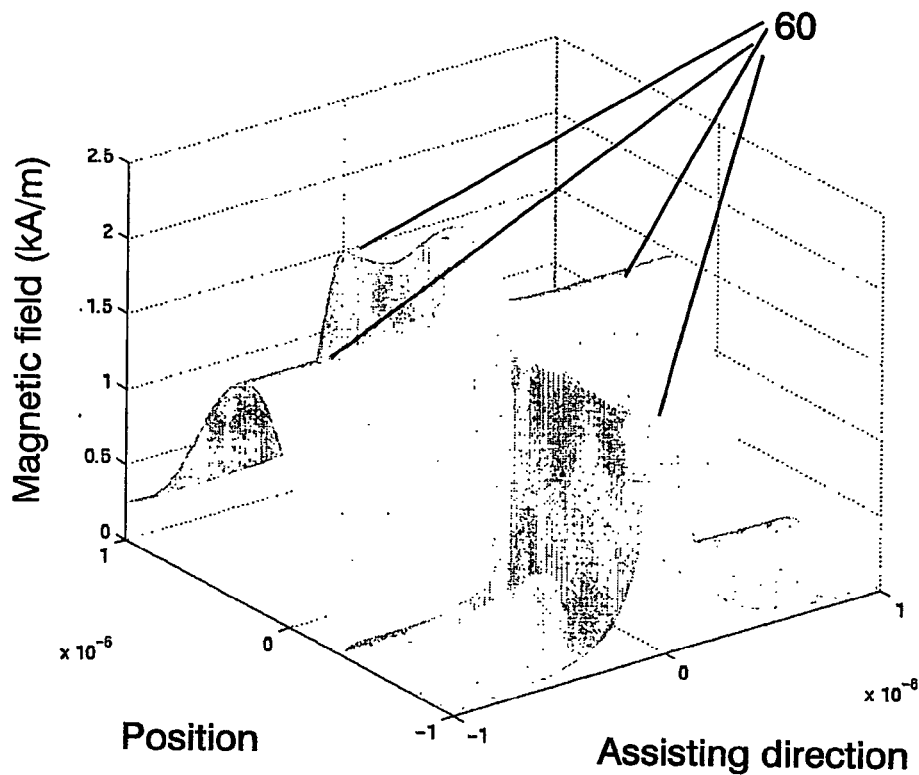

FIG. 7 is a graph showing a calculated 3-dimensional magnetic field amplitude, taking into account currents in the row line, the column line, the supplementary column line influencing the magnetic field at the selected column and the supplementary column line influencing the magnetic field at the non-selected column.

Figure 8:
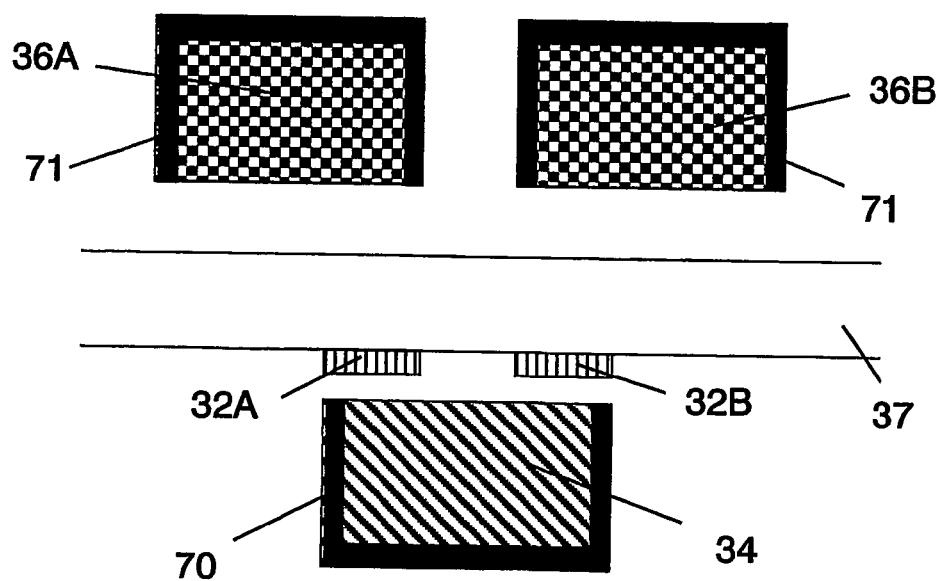

FIG. 8 illustrates the concept of the present invention according to a further embodiment with cladding of current lines.

Figure 9:
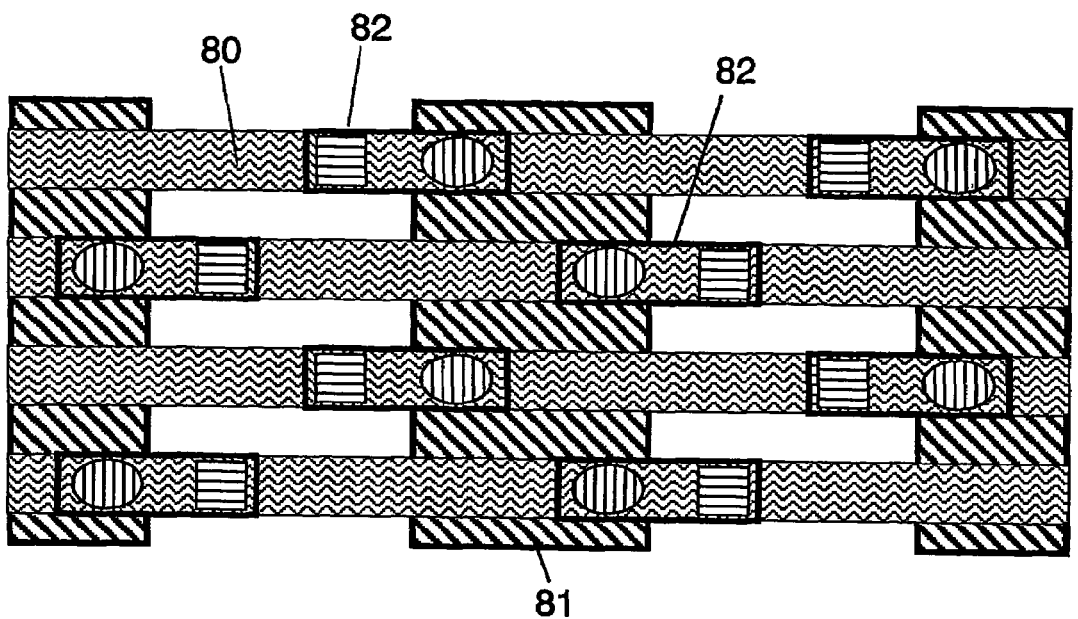
Figure 9:
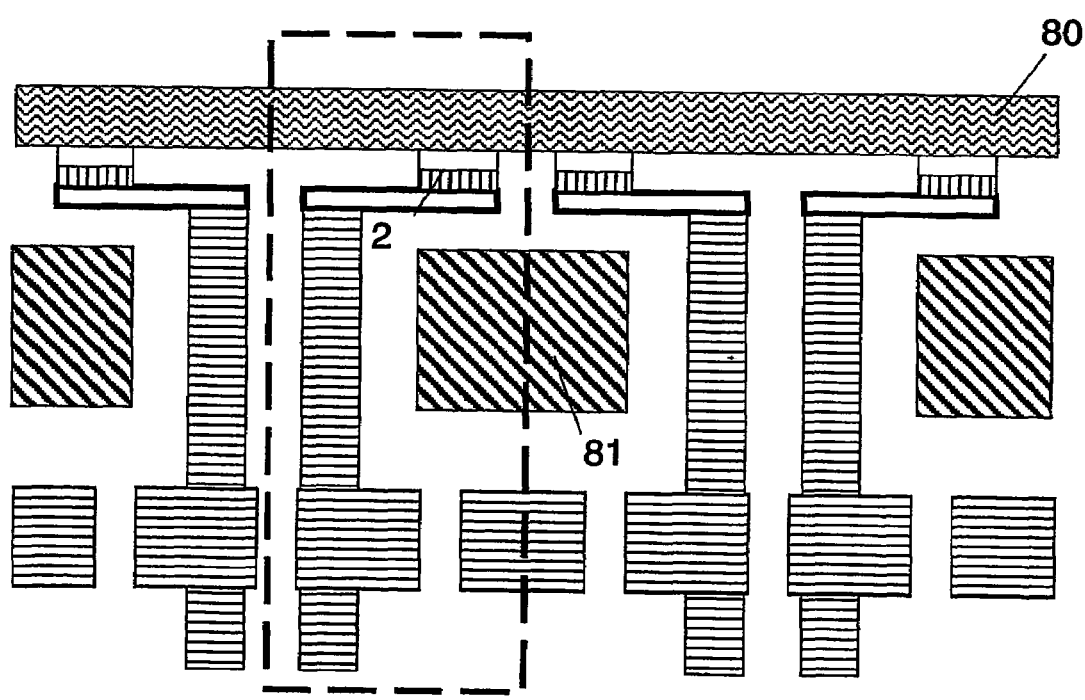

FIG. 9 is a top view and a cross-sectional view of an integration layout with shared column line according to the prior art.

Figure 10:
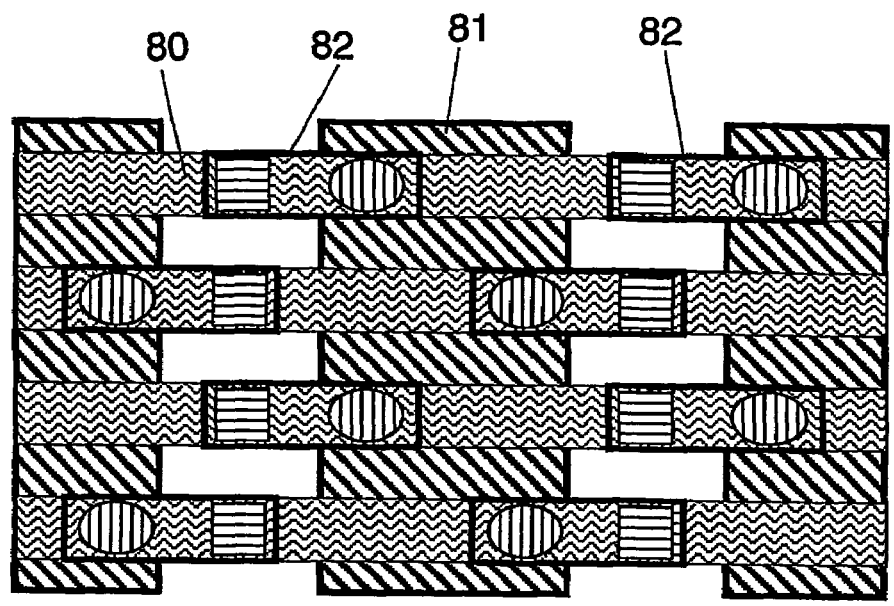
Figure 10:
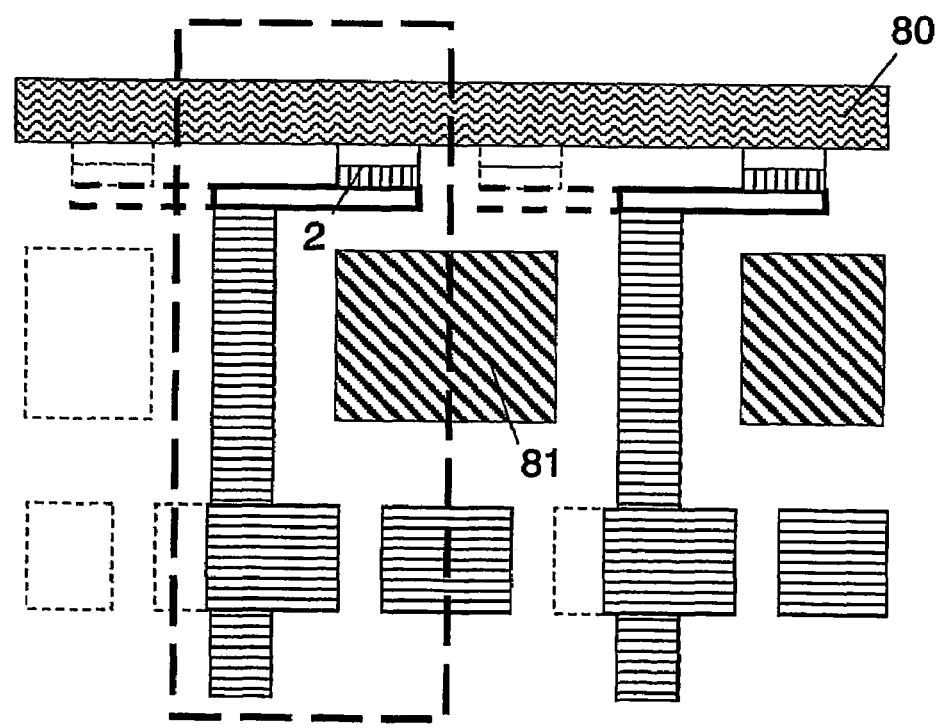

FIG. 10 is a top view and a cross-sectional view of an integration layout with shared column line according to the prior art, with density improvement.

Figure 11:
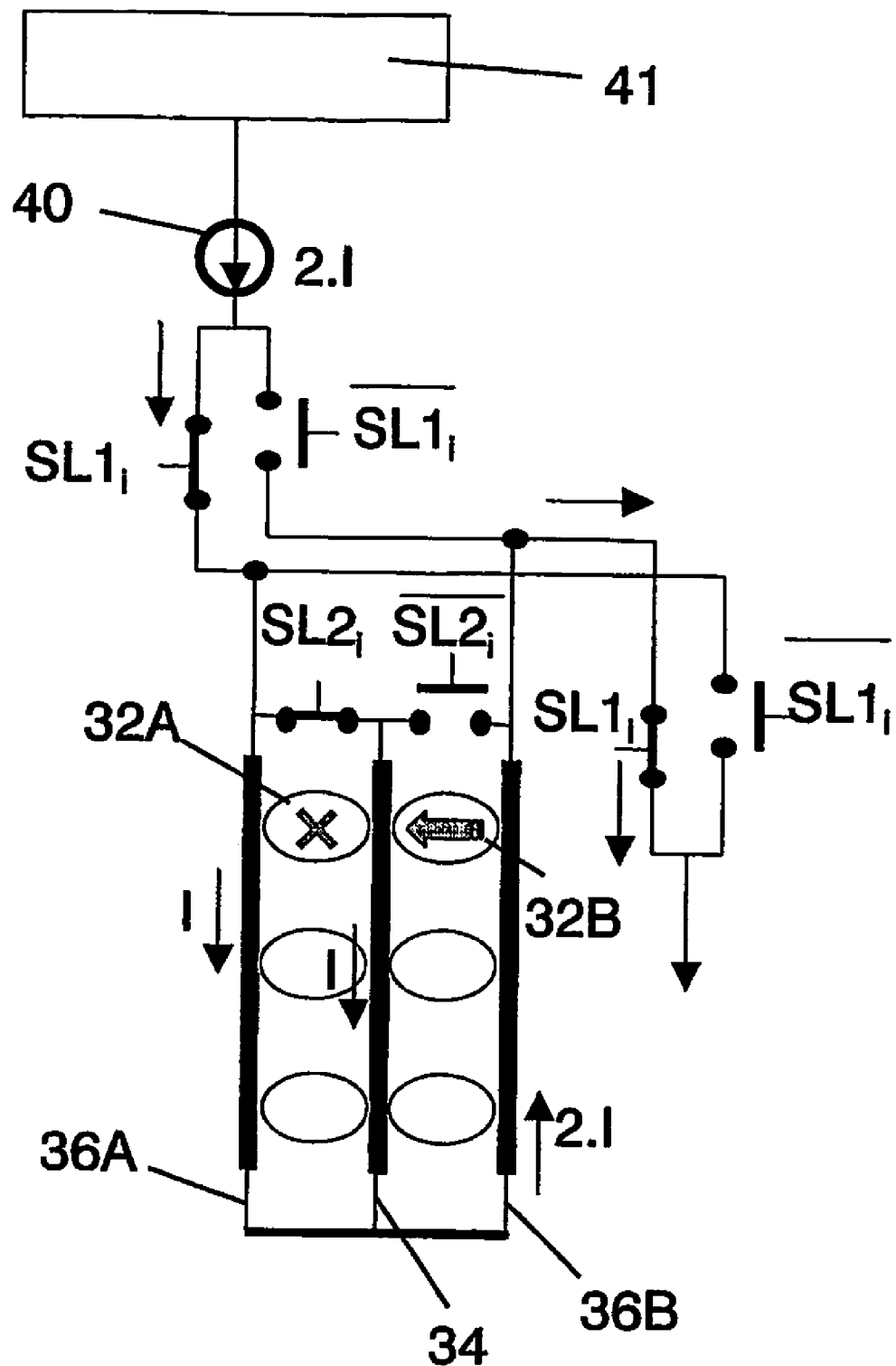

FIG. 11 is a schematic explanation of the creation of different current paths.

Figure 12:
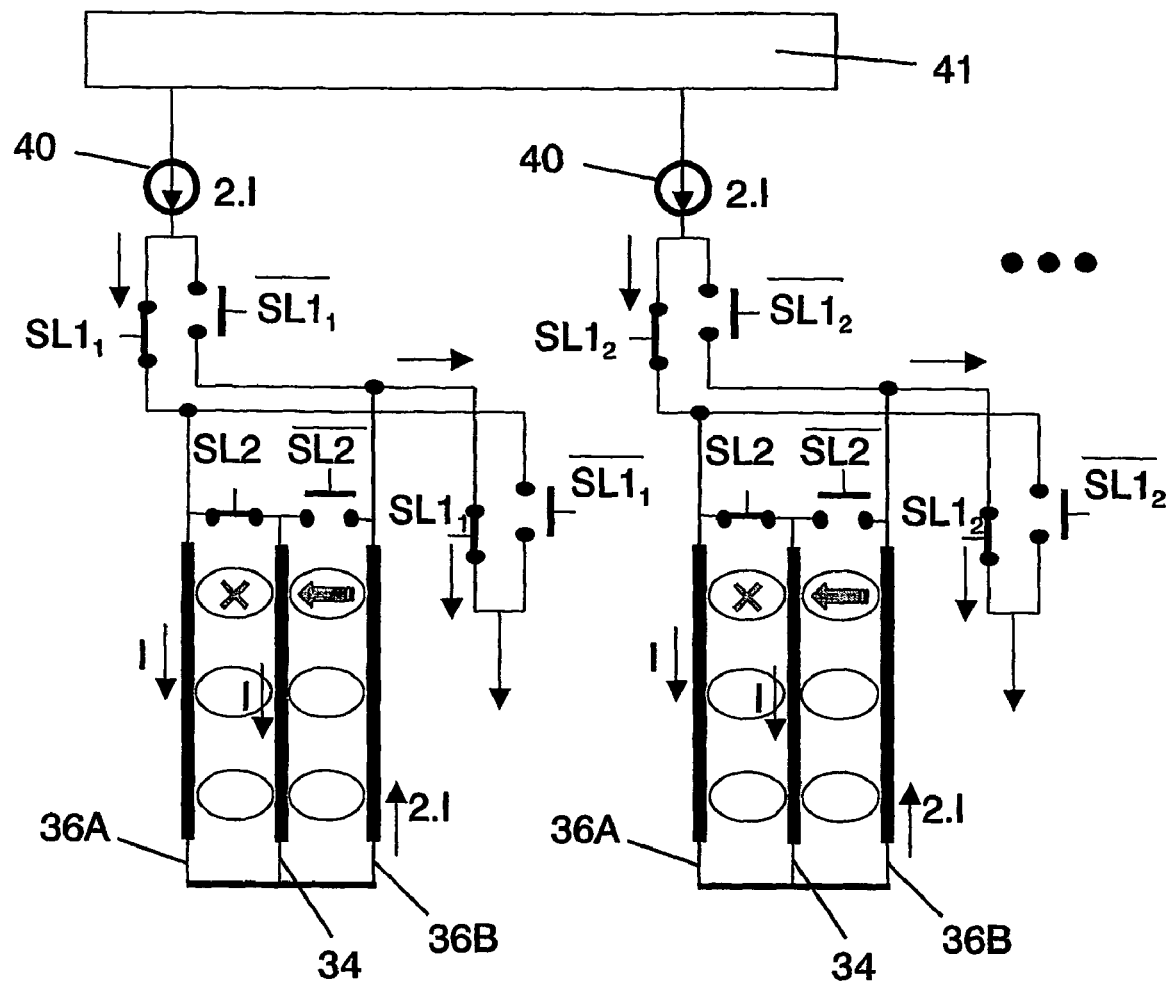

FIG. 12 is a schematic diagram of an MRAM architecture according to the present invention for word-parallel write operations.

Figure 13:
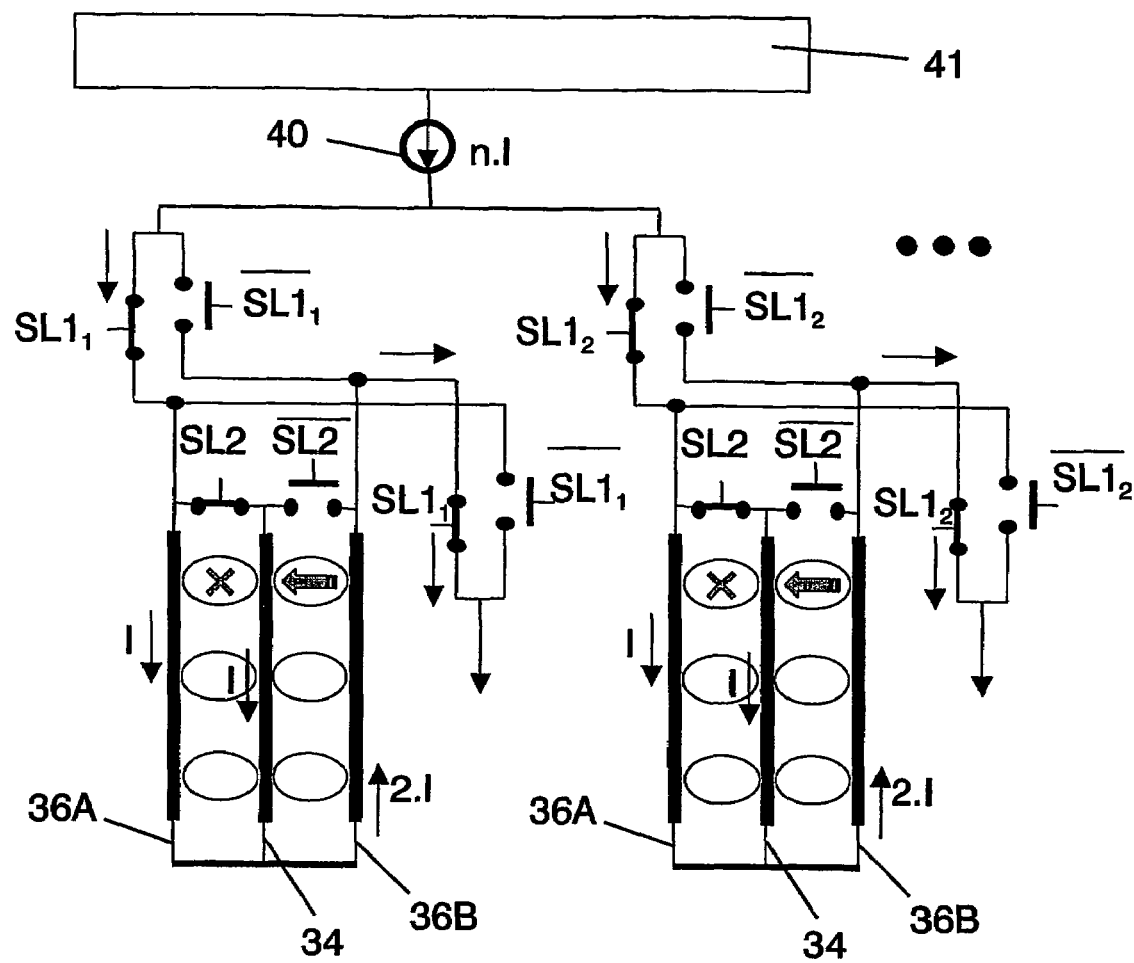

FIG. 13 is a schematic diagram of a further embodiment of the present invention with a single current source for simultaneously providing an equally distributed current to different bits in a word.

Figure 14:
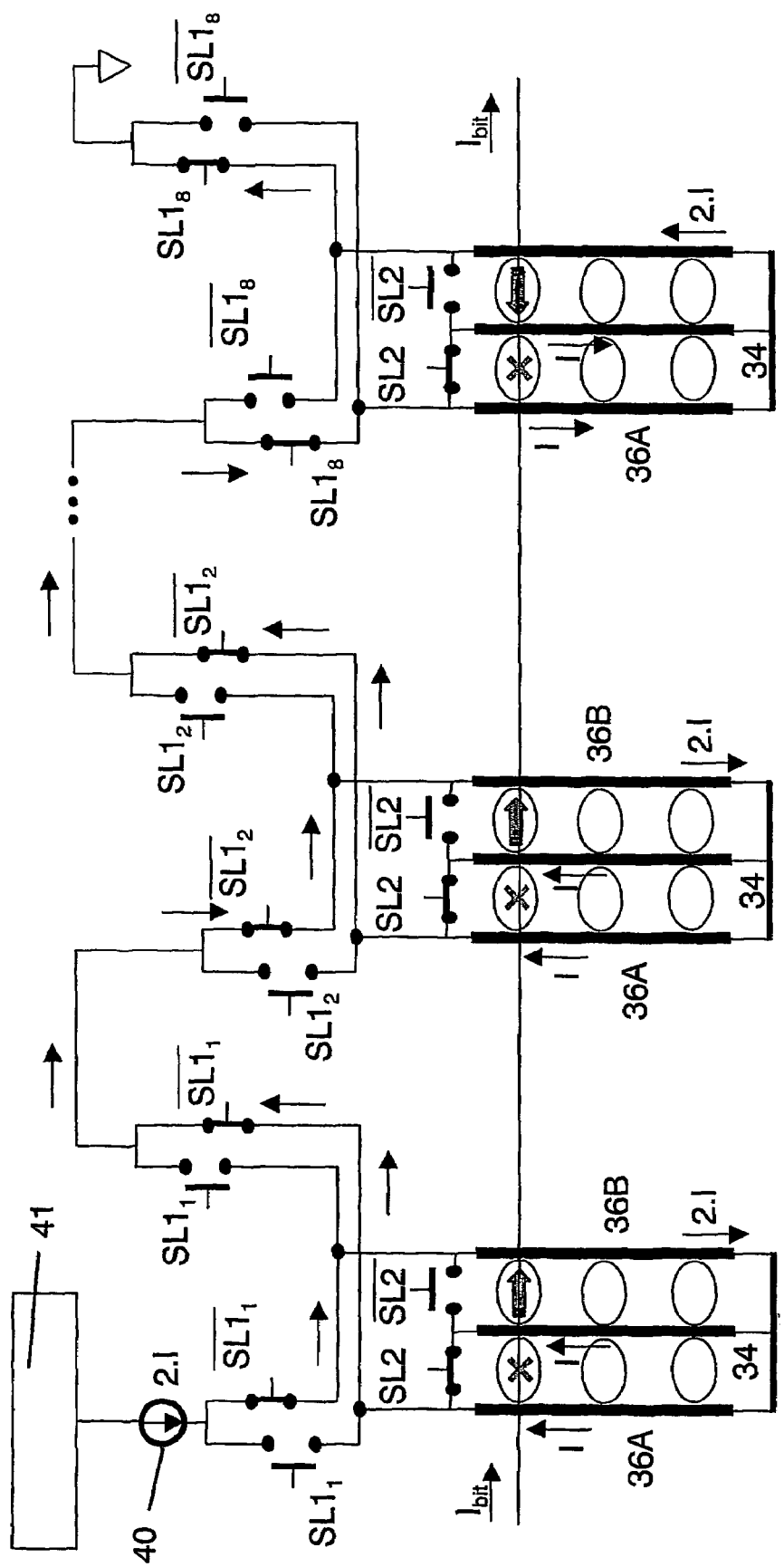

FIG. 14 schematically illustrates a serial single current source word-parallel MRAM.

In the different figures, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Figure 4:
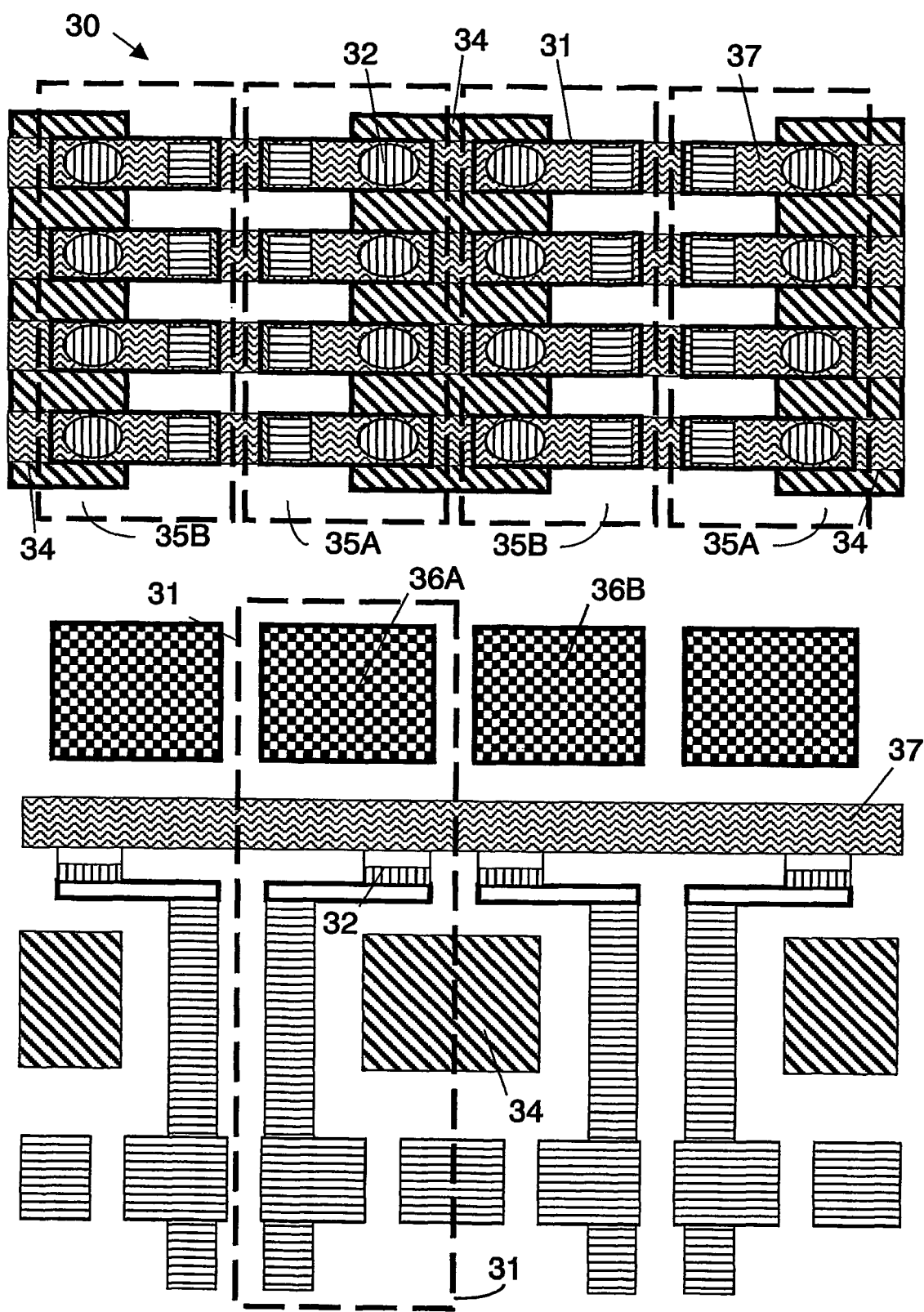
FIG. 4 is a top view and a cross-sectional view of an integration layout with shared column line according to an embodiment of the present invention, the cross-sectional view showing supplementary column lines according to the present invention, which have been removed for the top view.

According to an embodiment of the present invention, as illustrated in FIG. 4, a matrix 30 of magnetoresistive memory cells 31, each memory cell 31 comprising a magnetoresistive memory element 32, is logically organized in rows and columns. Throughout this description, the terms "horizontal" and "vertical" are used to provide a coordinate system and for ease of explanation only. They do not need to, but may, refer to an actual physical direction of the device. Furthermore, the terms "column" and "row" are used to describe sets of array elements which are linked together. The liking can be in the form of a Cartesian array of rows and columns however the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, the claims refer to logically organized rows and columns. By this is meant that sets of memory elements are linked together in a topologically linear intersecting manner however, that the physical or topographical arrangement need not be so. For example, the rows may be circles and the columns radii of these circles and the circles and radii are described in this invention as "logically organized" rows and columns. The terms "row" and "column" are interchangeable. Also, specific names of the various lines, e.g. bit line and word line, or row line and column line, are intended to be generic names used to facilitate the explanation and to refer to a particular function and this specific choice of words is not intended to in any way limit the invention. It should be understood that all these terms are used only to facilitate a better understanding of the specific structure being described, and are in no way intended to limit the invention.

According to the present invention, column lines 34 are provided, which are continuous conductive strips, e.g. copper lines, which are magnetically couplable to the magnetoresistive elements 32 of a column in the array 30. These column lines 34 are each shared by two adjacent columns 35A, 35B of magnetoresistive elements 32 in the array 30. The area of a column line 34 is such that it substantially extends over at least the magnetoresistive elements 32 of both adjacent columns 35A, 35B sharing the column line 34, as illustrated in FIG. 4, and this for every row. The area of the column line 34 may be, but does not need be, so as to extend over substantially the complete width of both columns 35A, 35B. By sharing a column line 34 over two adjacent columns 35A, 35B according to the present invention, a single current line is created with a much larger cross-section than each of the current lines 4 for adjacent columns in the prior art MRAM devices, as can be seen by comparing FIG. 3 with FIG. 4. Contrary to the prior art, two memory elements 32 in two different columns 35A, 35B sharing one and the same column line 34 are provided on one single row.

Figure 3:
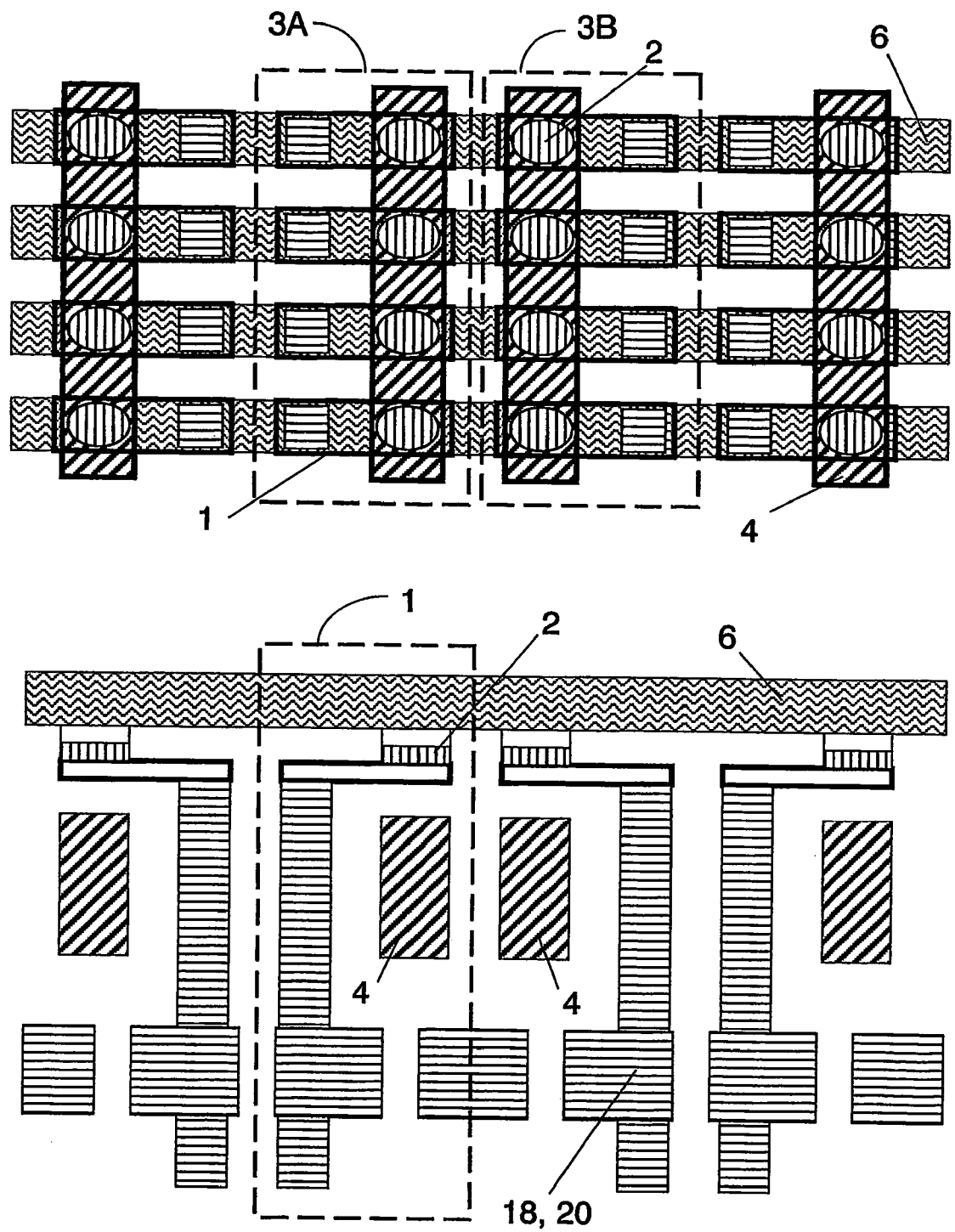
FIG. 3 is a top view and a cross-sectional view of a typical integration layout for a 1T-1MTJ MRAM according to the prior art.

The interleave-mirrored structure of memory elements 32 as represented in FIG. 3 and in FIG. 4 is used to save a transistor contact by sharing one contact between neighboring transistors (not represented in FIGS. 3 and 4).

Figure 1:
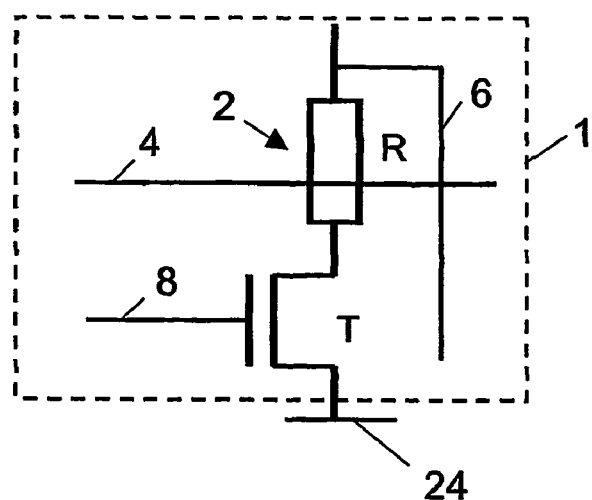
FIG. 1 is an electrical-representation of an MRAM unit for connection in an array according to the prior art.
Figure 5:
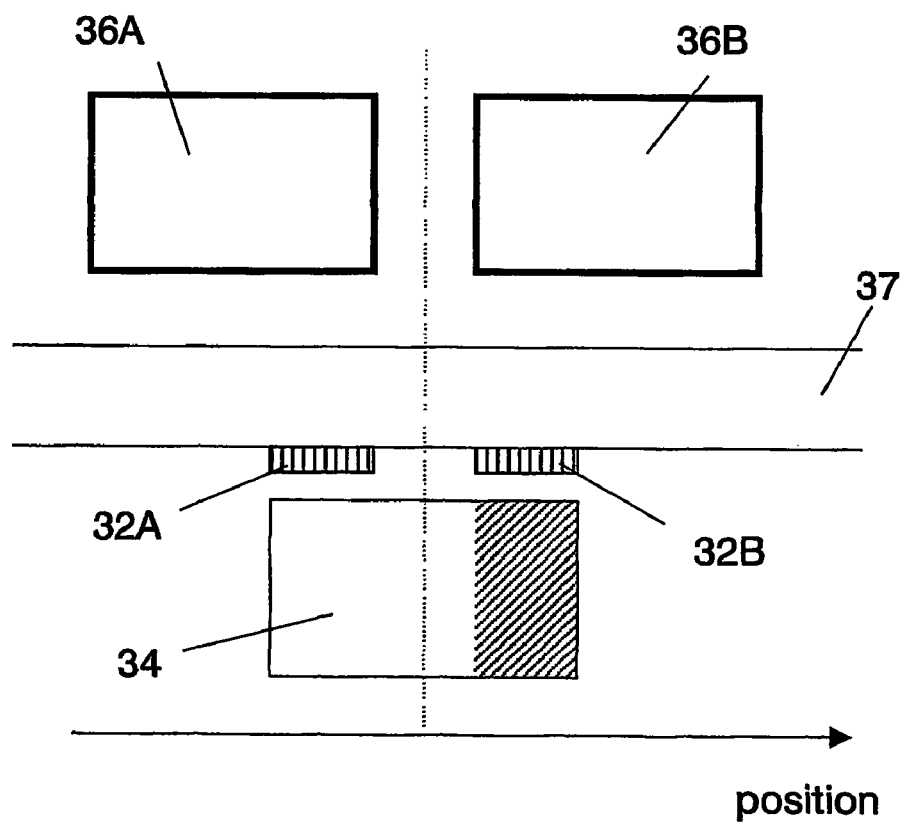
FIG. 5 illustrates the shared current line concept of the present invention in a 1T-1MTJ MRAM.
Figure 2:
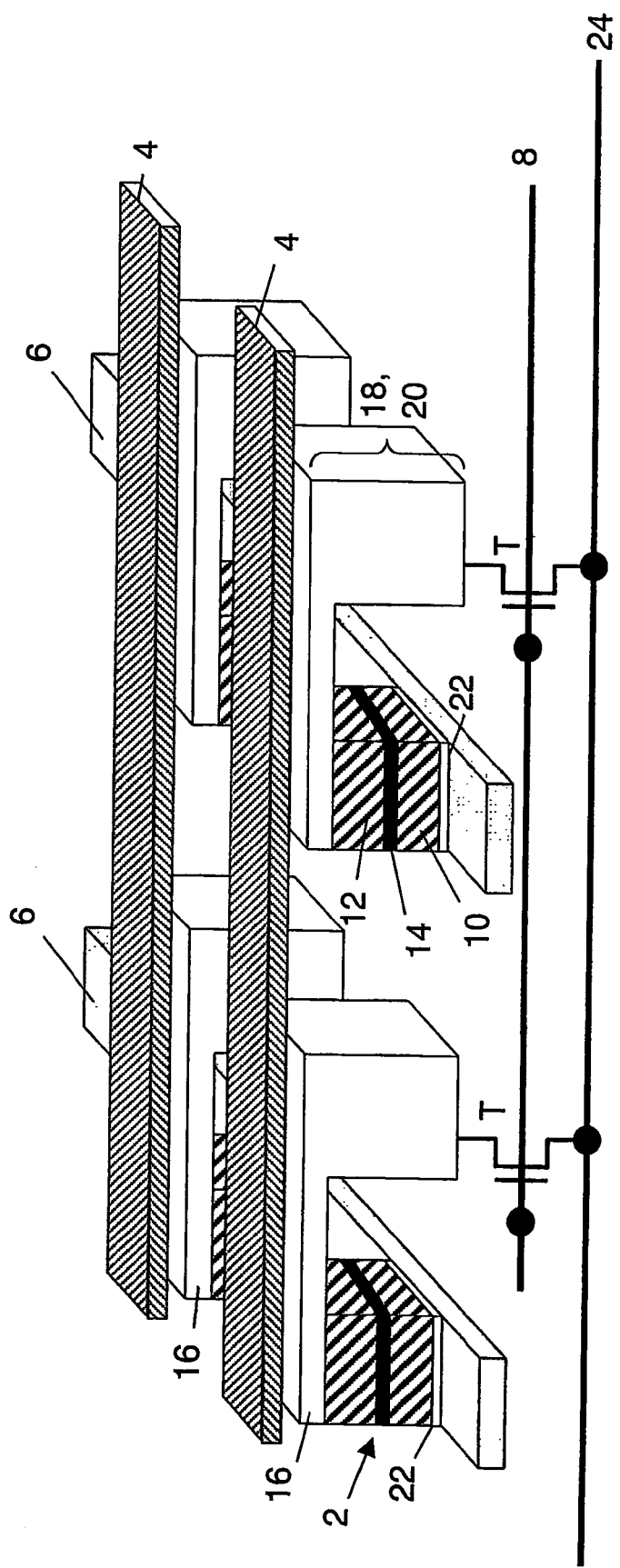
FIG. 2 is a diagrammatic elevational view of a 2×2 array of MTJ units according to the prior art.

As illustrated in FIG. 4 and more schematically in FIG. 5, rectangular current lines, column lines 34, with a height H smaller than a width W are possible, even when scaling down magnetoresistive memory devices, even in a sub-100 nm design. The use of a column line 34 with height H smaller than width W gives rise to more homogeneous magnetic fields being created. Moreover, the cross-section of the shared column line 34 according to the present invention is roughly tripled, which implies that a peak current through that column line 34 can significantly increase without danger for electromigration.

In order to generate a localized magnetic field in one of the bits-or memory elements 32 on the shared column line 34, for example memory element 32B, not only a magnetic field has to be generated by sending current through an appropriate row line 37, but, according to the present invention, also a further magnetic field has to be generated by sending current through an appropriate supplementary column line 36B. Row lines 37 are continuous conductive strips, e.g. copper lines, which are magnetically couplable to the magnetoresistive elements 32 of a row in the array 30. Supplementary column lines 36, 36A, 36B are continuous conductive strips, e.g. copper lines, which are magnetically couplable to the magnetoresistive elements 32 of a column 35A, 35B in the array 30. Preferably the supplementary column lines 36 and the shared column lines 34 are located each at opposite sides of a column of memory elements 32. The supplementary column lines 36 may be separately and independently driven column lines, the magnetic field of which influences at least the memory elements 32 of a selected column 35B of the columns 35A, 35B sharing the column line 34, so as to increase the generated magnetic field at the memory elements 32 of that selected column 35B. The supplementary column line 36 may furthermore influence the memory elements 32 of a non-selected column 35A of the columns 35A, 35B sharing the column line 34, so as to decrease the generated magnetic field at the memory elements 32 of that non-selected column 35A. Alternatively, the magnetic field generated by the supplementary column line 36 may influence the memory elements 32B of a selected column 35B more than the memory elements 32 of the non-selected column 35A of the adjacent columns 35A, 35B sharing the column line 34. According to an embodiment, the supplementary column lines 36 may be return path lines from column lines 34. The supplementary column line 36 may be a single current line, or it may comprise a plurality of current lines. Part of the current in the supplementary column line 36, e.g. in case the supplementary column line 36 consists of a plurality of current lines, may be used to create an opposite magnetic field at the location of the bits or memory elements 32 of the non-selected column 35A, in order to reduce or annihilate the magnetic field present there as generated by the column line 34. The other part of the current in the supplementary column line 36 is used to increase the magnetic field at the location of the bit memory elements of the selected column 35B. The supplementary column lines 36A, 36B may be placed offset in a row-direction with regard to a corresponding column 35A, 35B of memory elements 32. Alternatively, the supplementary column lines 36A, 36B may be placed symmetrically in a row-direction with regard to a corresponding column 35A, 35B of memory elements 32.

A supplementary column line 36 may be created in a standard metal layer in semiconductor processing; and can thus easily be-incorporated in existing magnetic memory production processing such as e.g. CMOS processing.

In the following, the concept of the present invention is demonstrated using current line geometries typical for a CMOS090 process. The geometries used for the calculations are summarized in Table 1. Lines 34, 37, 36A and 36B are column line 34, row line 37, and first and second supplementary current lines 36A, 36B respectively. As an example, a memory cell 32B in column 35B has to be written with either of two binary values; e.g. "0" or "1".

TABLE 1

| Line | Current (mA) | Width (nm) | Height (nm) | Distance (nm) | Offset (nm) |
| --- | --- | --- | --- | --- | --- |
| 34 | 1 | 540 | 325 | 110 | 0 |
| 37 | 0.94 | 160 | 140 | 50 | 0 |
| 36A | 1 | 500 | 250 | 400 | −320 |
| 36B | −2 | 500 | 250 | 400 | 320 |

"Distance" is the distance between the free layer of a memory element 32, 32A, 32B closest to the relevant line 34, 37, 36A, 36B, and a surface of the line 34, 37, 36A, 36B closest to the memory element 32, 32A, 32B. "Offset" is the distance between the center of a column line 34, and the center of the supplementary column lines 36A, 36B respectively.

As an example, in the embodiment of table 1, the current level of supplementary column line 36B equals the sum of the current levels of column line 34 and supplementary column line 36A. Hence it is possible to design a system in which supplementary column line 36B forms a return current path for both column line 34 and supplementary column line 36A. A single current source can be provided, which can generate all currents involved.

By directing the current into the shared column line 34 and one of the supplementary column lines 36A, 36B, and returning it through the other supplementary column line, or by sending it through one of the supplementary column lines 36A, 36B and returning it through the shared column line 34 and the other supplementary column line, a unipolar current source 40 can be used. Depending on the choice of the supplementary column line 36A, 36B for the functional return path, a selection of one of the columns 35A, 35B is made for generating a higher magnetic field. Depending on the direction of the current in the shared column line 34, it is established which one of two binary values, e.g. "0" or "1", will be written in a selected memory element 32. The combination in the selected magnetoresistive element 32B of the magnetic fields generated by current in an appropriate shared column line 34, in an appropriate supplementary column line 36B and in an appropriate row line 37, provides a magnetic field able to change the direction of the magnetic vector of the free layer of this selected memory element 32B. Either of the magnetic fields by itself, or a combination of not all those magnetic fields, is not able to change the storage state. Therefore only the selected memory cell 31 is written even though the shared column line provides a magnetic field in the memory elements 32 of two adjacent columns 35A, 35B. A power supply (not represented) provides the necessary power for generating the row currents, the column currents and the supplementary column currents. Only a limited number of memory cells 31 are shown in FIG. 4, but in practice the memory array 30 can be of any size.

As illustrated in FIG. 11, to select the current direction in the column line 34 and in the supplementary column lines 36A, 36B, a couple of current direction switches SL1, $\overline{SL1}$, SL2, $\overline{SL2}$, such as e.g. semiconductor switches or transistors, and a switching mechanism (not represented in FIG. 11) for switching the current direction switches are provided. Depending on whether a value needs to be written in memory element 32A or in memory element 32B, and depending on the value to be written, the current direction switches are brought into an appropriate state (open or closed) by the switching mechanism.

If a first binary value, for example a "0", needs to be written e.g. in memory element 32B, as an example it may for example be needed to have a current of −1 mA in supplementary column line 36A, a current of −1 mA in shared column line 34 and a current of 2 mA in supplementary column line 36B. A power supply 41 provides the necessary power for generating the necessary currents. Switches SL1 and SL2 in a state so as to be able to conduct current, e.g. they are closed, and switches $\overline{SL1}$ and $\overline{SL2}$ are in a state so as to block current, e.g. they are opened. The current 2.I, provided by the current source 40 is divided over the supplementary column line 36A and the shared column line 34, and is recombined and returned to supplementary column line 36B. It is to be noted that, in the embodiment represented in FIG. 11, all current lines 34, 36A, 36B are connected by a simple short-circuit at one side of the memory matrix.

The full logic functions for the switches SL1, SL2, $\overline{SL1}$ and $\overline{SL2}$, i.e. for writing the logic values in both elements 32A, 32B, are shown in the tables hereinunder. SL1 and $\overline{SL1}$ are in an inverse state respectively, i.e. if one is conducting, the other is not, and SL2 and $\overline{SL2}$ are in an inverse state respectively.

| SL1 | 0 | 1 |
|---|---|---|
| Element 32A | 0 | 1 |
| Element 32B | 1 | 0 |
| SL2 | 0 | 1 |
| Element 32A | 0 | 0 |
| Element 32B | 1 | 1 |

The switches SL1, SL2, $\overline{SL1}$ and $\overline{SL2}$ do not simply determine the polarity of the current in the current lines 32A, 32B, 34 when selected. Depending on whether left or right elements 32A, 32B are to be written, the function of the switches SL1, $\overline{SL1}$ is reversed. A possible alternative would be to use a different magnetisation state for storing a logic value in left and right elements, i.e. for the left elements 32A a first memory state, e.g. "0", would mean e.g. "magnetisation-to-the-left", whereas for right elements 32B a first memory state, would mean "magnetisation-to-the-right".

The switches SL2 and $\overline{SL2}$ distinguish between writing on the right and left elements 32A, 32B respectively, on a shared column line 34.

Different bit-specific current source/sink units can be combined into a larger entity for word-parallel writing. This is schematically represented in FIG. 12. The current driver is then simply responding to the data to be written in the following way. In e.g. an 8-bit version, upon receipt of the word 10000110, the switches SL1, SL2, $\overline{SL1}$, $\overline{SL2}$ are closed for the sequence of bits in an appropriate way so as to be able to write the sequence 1-0-0-0-0-1-1-0 in subsequent bits. Since left and right bits on a shared current line cannot be written simultaneously, the write operation can be performed in two steps, by first writing the odd bits of the word (left elements=1-0-0-1), followed by the even bits (right elements=0-0-1-0). All switches SL2, $\overline{SL2}$ can then be controlled using a single signal line for the whole matrix, e.g. odd/even.

According to an embodiment of the present invention, making use of the intrinsic resistance equality in the different channels, a single current source (with level ~n.I) may be used, rather than n/2 different smaller current sources (level ~2.I). The principle is sketched in FIG. 13. The decision about the ultimate implementation should be based on a smaller variation in the current line resistance values, rather than the different current source levels. In other words, when the statistical variation in the resistance of the different current loops is very small, a single current source built around an enlarged-gate transistor may give a better control over the current levels in the different loops.

FIG. 14 shows a serial approach by feeding the current sink of the first pair of bits into the current source of the second pair, etc. If each of the switches SL1, SL2, $\overline{SL1}$, $\overline{SL2}$ are appropriately switched, the right content can be simultaneously written to one bit of each pair of bits. Therefore, a smaller current source 40 proves to be adequate, thus saving substrate area, e.g. silicon area. In this approach, the advantages of a smaller power consumption are combined with a fast write time and a low peak current. In a modular approach for MRAM, smaller memory banks or blocks may be used to reduce the overall current line resistance. This is typically done to reduce voltage losses over the current lines.

An additional way of writing data can be introduced for word-parallel writing. In this case, all the odd bits, i.e. the left bits 32A of each shared column line are written first, followed by the even bits, i.e. the right bits 32B. All switches SL2, $\overline{SL2}$ can then be controlled using a single signal line for the whole matrix, e.g. odd/even.

Since, in this case, the writing of even and odd bits has to be separated, two words can be interleaved. A memory bank then consists of twice the number of bits in a word. Supposing that an 8-bit word is used, two different words can be written on one line, hence 16 bits in total.

For example:
word 1, for the left bits: 0 1 1 0 1 1 0 0
word 2, for the right bits: 1 1 1 1 0 0 0 0
interleaved, this gives: 01 11 11 01 10 10 00 00

The switch sequence would then be, as a function of time:

|  | writing of word 1 | writing of word 2 |
| --- | --- | --- |
| SL1 | -01101100- | -00001111- |
| $\overline{SL1}$ | -10010011- | -11110000- |
| SL2 | -0- | -1- |
| $\overline{SL2}$ | -1- | -0- |

FIG. 6 shows the magnetic field component profile, orthogonal to the selected current lines 34, 36A, 36B, for the embodiment of FIG. 5, with current values as given in Table 1. By proper choice of current line dimensions, as in Table 1 above, the magnetic field extreme value can be localized at one of the devices 32A, 32B, in the example given at device 32B. Graph 50 is a graph in case a current through the shared column line 34 is simply returned through the supplementary column line 36B corresponding to the selected column 35B. It is to be noticed that a high magnetic field is generated at the selected memory element 32B. Unfortunately, the magnetic field at a neighboring, non-selected bit or memory element 32A is also rather high in this configuration. A good estimate is that the field there is about half the size as for the selected bit or memory cell 32B, as can also be seen in graph 50 of FIG. 6. The magnetic field at the non-selected memory element 32A can be decreased by using the supplementary column line 36A corresponding to the non-selected column 35A. Current is sent through the shared column line 34 and the supplementary column line 36A corresponding to the non-selected column 35A, thus effectively creating an opposite field at the non-selected memory element 32A, so that the cross-talk is suppressed, and is returned to the supplementary column line 36B corresponding to the selected column 35B. This way, the magnetic field at the non-selected element 32A maybe reduced to ~25% of the maximum field, as represented in graph 51 of FIG. 6. The field profile may be further improved by proper choice of the geometry, i.e. current, width, height, offset, overlap, etc. while taking into account geometrical constraints imposed by advanced semiconductor design.

FIG. 7 shows a 3-dimensional magnetic field profile, i.e. magnitude in function of position and direction, in case no current is sent through the supplementary column line 36A of a non-selected column 35A. In the example given, the current in the column line 37 was chosen such that both magnetization components used for writing are equal, giving the optimal noise margin. The potentially disturbing half-select fields 60, at 70% of maximum 2-dimensional field amplitude, i.e. comprising only one field component, are clearly visible.

Power consumption is analyzed. Supposing that the original current line 4 (corresponding to the hatched part of column line 34 in FIG. 5) has a resistance R, it can be assumed that the resistance of the wider current line 34 according to the present invention is approximately R/2.5.

If a current I is sent through a current line with resistance R, the current line having the same width as a memory element and being placed symmetrically with respect to that memory element, then the power needed to generate a magnetic field H in the memory element is $R.I^2$. If power efficiency is defined as the ratio between the power consumption to generate a magnetic field, and the generated magnetic field itself, the power efficiency for this situation is $(R.I^2)/H$. In order to obtain a magnetic field 2H with this-configuration, a current 2I can be sent through the current line. The power needed then is $R.(2I)^2$, and the power efficiency is $2.R.I^2/H$. If, however, a current I is sent through a column line, and a corresponding return current is sent through a return path, the memory element, the column line and the return path having the same width and being placed symmetrically with respect to each other, the power needed to generate a magnetic field 2H in the memory element is $(R.I^2+R.I^2)$, and the power efficiency is $(R.I^2+R.I^2)/(2H)$, or thus $(R.I^2)/H$. This means that by using a functional return path, i.e. a return path which substantially contributes to the generation of a magnetic field in a selected memory cell, magnetic fields generated in the magnetic memory cells are doubled for a same power consumption.

Or thus, by sending current through the shared column line 34 and the supplementary column line 36B corresponding to the selected column 35B (as graph 50 in FIG. 6), the field magnitude can be increased by 40% for a same current, while the power consumption is reduced by 20% $(2(R/2.5)I^2$ versus $RI^2)$. For a return path, which would be equally contributing to the total field, a higher increase of magnetic field can be obtained. However, for a same power consumption, the field is increased by 50% by scaling of the current level.

When using a first supplementary column line 36B increasing the magnetic field in a selected column 355B and a second supplementary column line 36A decreasing the magnetic field in an adjacent, non-selected column 35A, the current levels can be chosen such that all the current is sent through column line 36B and then distributed over 34 and 36A, in a parallel way. For current levels taken from Table I, power consumption is increased with a factor 3 with respect to the original digit line design, which results in an effective field gain of 1.9. To realize this gain in the original design, linear current scaling would lead to a factor 3.6 increase in dissipation, which would exceed the electromigration limit. Again, for a same dissipation, this would still result in a 21.5% effective field increase.

| | Ref. No. | Current | Max. Field (kA/m/mA) | Power consumption for one field component only | Total power consumption (incl. bit line) |
|---|---|---|---|---|---|
| Simple line | 4 | 1 mA | 0.782 - 100% | $R.I^2$ | $2.R.I^2$ |
| Line with return | (not shown) | 1 mA −1 mA | 1.522 - 200% | $2.R.I^2$ | $3.R.I^2$ |
| Wider line with Return (offset) | 34 36B | 1 mA −1 mA | 1.066 - 140% | $2.(R/2.5).I^2 = 0.8.R.I^2$ | $1.8.R.I^2$ |
| Same width diff. current levels | 34 36B | 1 mA −2 mA | 1.627 - 210% | $(R/2.5).(I^2 + (2.I)^2) = 2.R.I^2$ | $3.R.I^2$ |
| Same width diff. Current levels (cfr Table I) | 34 36A 36B | 1 mA 1 mA −2 mA | 1.470 - 190% | $(R/2.5).(2.I^2 + (2.I)^2) = 2.4.R.I^2$ | $3.4.R.I^2$ |

The maximum achievable magnetic field using a shared digit line can be up to 10 kA/m as calculated by linearly scaling the obtained results, taking into account that the maximum current density should not exceed $10^7$ A/cm$^2$ or, in other words, 1 mA per (100 nm)$^2$ line section. The maximum current in column line 36B is therefore limited to 12 mA in the example given.

According to a further embodiment of the present invention, flux guiding cladding layers 70, 71 (FIG. 8) may be provided at the column lines 34, at the supplementary column lines 36A, 36B and/or at the row lines 37. These flux guiding cladding layers 70, 71 are of a high permeability and magnetically soft (low coercivity), such as e.g. nickel iron (NiFe). These flux guide cladding layers 70, 71 lead to a better localization of the magnetic field into the area of the selected cell. A gain of factor 2 in field magnitude can be realized this way. Moreover, the selectivity to neighboring memory elements 32 is enhanced, and thus cross-talk in neighboring memory elements 32 is reduced by using such flux guiding cladding layers 70, 71. The flux guiding cladding layer 70, 71 may cover only one side of a row line 37, column line 34, or supplementary column line 36A, 36B, preferably the side away from the memory element 32, or it may cover up to three sides thereof (as shown in FIG. 8) for maximum efficiency. The use of magnetic cladding layers 70, 71 increases magnetic field levels. Moreover, the magnetic field homogeneity improves, while cross-talk to the neighboring bit can be greatly reduced. In this embodiment, this would mean that the current in the supplementary column line 36A to reduce the field at the non-selected bit or memory element 32A can possibly be chosen smaller, or even omitted.

The implementation of magnetic cladding layers 70, 71 in current lines as described in this invention disclosure becomes technologically simpler in comparison to previous integration schemes. Due to the strongly increased current line cross-section, the effective loss of cross-section by implementing cladding layers 70, 71 is rather limited, which makes it a far more attractive option.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. An array with magnetoresistive memory cells arranged in logically organized rows and columns, each memory cell including a magnetoresistive element, the matrix comprising
    a set of column lines, the column lines provided with a flux guiding cladding layer,
        a column line being a continuous conductive strip which is magnetically coupled to the magnetoresistive element of each of the memory cells of a column,
        a column line being shared by two adjacent columns, the shared column line having an area which extends over substantially the magnetoresistive elements of the two adjacent columns sharing that column line, the shared column line having a height smaller than width, the array furthermore comprising at least one supplementary column line per column for generating a localized magnetic field in the magnetoresisive elements of one of the adjacent columns sharing the column line.

2. The array of claim 1, wherein a supplementary column line forms a return current path for current carried by a column line.

3. The array of claim 1, wherein a column line and a supplementary column line are provided at opposite sides of a column of magnetoresistive elements.

4. The array of claim 1, wherein a column of magnetoresistive elements is placed offset in a row-direction with regard to a center of a supplementary column line.

5. The array according to claim 1, wherein the supplementary column line is provided with a flux guiding cladding layer.

6. Non-volatile memory comprising the array with magnetoresistive memory cells of claim 1.

7. An array with magnetoresistive memory cells arranged in logically organized rows and columns, each memory cell including a magnetoresistive element, the matrix comprising
    a set of column lines, the column lines provided with flux guiding claddling layer,
        a column line being a continuous conductive strip which is magnetically coupled to the magnetoresistive element of each of the memory cells of a column,
        a column line being shared by two adjacent columns, the shared column line having area which extends over substantially the magnetoresistive elements of the two adjacent columns sharing that column line, the shared column line having a height smaller than width, the array furthermore comprising at least one supplementary column line per column for generating a localized magnetic field in the magnetoresistive elements of one of the adjacent columns sharing the column line; and a set of row lines, the row lines provided with a flux guiding cladding layer, each row line being a continuous conductive strip which is magnetically coupled to the magnetoresistive element of each of the memory cells of a row.

8. A method of writing an array with magnetoresistive memory cells arranged in logically organized rows and columns, each cell including a magnetoresistive element, comprising:

applying current to a row line, applying current to a column line having a flux guiding cladding layer and having a height smaller than width, and shared by two columns, and applying current to at least one supplementary column line for generating a localized magnetic field in one of the memory elements on the column line.

9. A method of manufacturing an array with magnetoresistive memory cells, comprising:

providing magnetoresistive memory cells arranged in logically organized rows and columns, each cell including a magnetoresistive element, providing a set of column lines, the column lines having a flux guiding cladding layer, a column line being a continuous conductive strip which is magnetically coupled to the magnetoresistive element of each of the memory cells of a column, a column line being shared by two adjacent columns, the shared column line having an area which extends over substantially the magnetoresistive elements of the two adjacent columns sharing that column line, the shared column line having a height smaller than width, providing at least one supplementary column line per column for generating a localized magnetic field in the magnetoresistive elements of one of the adjacent columns sharing the column line.

* * * * *